United States Patent
Liu et al.

(10) Patent No.: US 12,289,926 B2
(45) Date of Patent: Apr. 29, 2025

(54) ELECTRONIC DEVICE COMPRISNG A MICRO-LENS AND PHOTODIODE ARRAY WITH AMORPHIC N-TYPE AND P-TYPE LAYERS

(71) Applicant: InnoLux Corporation, Miao-Li County (TW)

(72) Inventors: Yu-Tsung Liu, Miao-Li County (TW); Wei-Ju Liao, Miao-Li County (TW); Po-Hsin Lin, Miao-Li County (TW); Chao-Yin Lin, Miao-Li County (TW); Te-Yu Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 510 days.

(21) Appl. No.: 17/410,410

(22) Filed: Aug. 24, 2021

(65) Prior Publication Data

US 2022/0102415 A1  Mar. 31, 2022

(30) Foreign Application Priority Data

Sep. 29, 2020 (CN) .......................... 202011049493.X

(51) Int. Cl.
  *H10F 39/00* (2025.01)
(52) U.S. Cl.
  CPC ....... *H10F 39/8063* (2025.01); *H10F 39/024* (2025.01); *H10F 39/802* (2025.01)
(58) Field of Classification Search
  CPC ......... H01L 27/14627; H01L 27/14603; H01L 27/14685; H01L 27/14678; H01L 27/14623; H10K 59/40
  See application file for complete search history.

(56) References Cited

U.S. PATENT DOCUMENTS

| | | | |
|---|---|---|---|
| 5,414,275 A * | 5/1995 | Sugawa | ............ H01L 31/03762 257/53 |
| 7,812,302 B2 | 10/2010 | Kuo et al. | |
| 7,833,810 B2 | 11/2010 | Lin et al. | |
| 9,240,428 B1 | 1/2016 | Tu et al. | |
| 9,276,025 B2 | 3/2016 | Wu et al. | |
| 9,825,078 B2 | 11/2017 | Hsieh et al. | |
| 9,837,455 B2 | 12/2017 | Lin et al. | |
| 10,268,884 B2 | 4/2019 | Jones et al. | |
| 2003/0020083 A1 * | 1/2003 | Hsiung | ............ H01L 31/02162 257/431 |
| 2007/0063126 A1 * | 3/2007 | Lee | ................... H01L 27/14623 257/E27.132 |

(Continued)

FOREIGN PATENT DOCUMENTS

| | | |
|---|---|---|
| CN | 101106145 A | 1/2008 |
| CN | 101217156 A | 7/2008 |

(Continued)

*Primary Examiner* — William B Partridge
*Assistant Examiner* — David Paul Sedorook
(74) *Attorney, Agent, or Firm* — McClure, Qualey & Rodack, LLP

(57) ABSTRACT

An electronic device is provided. The electronic device includes an optical sensing module that includes an optical sensor array. The optical sensor array includes at least one optical sensor, at least one transparent layer disposed on the optical sensor array, and a microlens array. The microlens array includes at least one microlens and is disposed on the transparent layer.

17 Claims, 7 Drawing Sheets

(56) References Cited

U.S. PATENT DOCUMENTS

| | | | |
|---|---|---|---|
| 2009/0189055 A1* | 7/2009 | Lin | H01L 27/14621 |
| | | | 250/208.1 |
| 2009/0237801 A1* | 9/2009 | Liu | G02B 3/0062 |
| | | | 359/622 |
| 2016/0073046 A1 | 3/2016 | Lukac et al. | |
| 2017/0338256 A1* | 11/2017 | Okihara | H01L 31/02165 |
| 2017/0345860 A1* | 11/2017 | Nagaya | H01L 27/14621 |
| 2018/0373945 A1* | 12/2018 | Wu | G02B 27/0988 |
| 2020/0081163 A1* | 3/2020 | Lin | G06V 40/1318 |
| 2020/0127066 A1 | 4/2020 | Zhang et al. | |

FOREIGN PATENT DOCUMENTS

| | | |
|---|---|---|
| CN | 101494231 A | 7/2009 |
| CN | 105280650 A | 1/2016 |
| CN | 105789362 A | 7/2016 |
| CN | 106709455 A | 5/2017 |
| CN | 106992193 A | 7/2017 |
| CN | 107451518 A | 12/2017 |
| CN | 108496180 A | 9/2018 |
| TW | 491032 B | 7/2015 |

\* cited by examiner

ELECTRONIC DEVICE COMPRISNG A MICRO-LENS AND PHOTODIODE ARRAY WITH AMORPHIC N-TYPE AND P-TYPE LAYERS

CROSS REFERENCE TO RELATED APPLICATIONS

This application claims the benefit of China Application No. 202011049493.X, filed Sep. 29, 2020, the entirety of which is incorporated by reference herein.

BACKGROUND

Technical Field

The present disclosure relates to an electronic device, and particularly it relates to an electronic device which can reduce noise and increase both the sensitivity and the sensing area.

Description of the Related Art

Existing optical image sensors are made of multi-layer lenses and wafer-based optical sensors. Due to the high cost of manufacturing wafer-based optical sensors, and the use of the multi-layer lens, the overall thickness of an optical image sensor can hardly be reduced. As a result, the optical image sensor that is made of a wafer-based optical sensor and a multi-layer lens cannot meet the current market requirements for sensor size, product thickness, price, and so on.

SUMMARY

In accordance with an embodiment of the present disclosure, an electronic device is provided, which contains an optical sensing module and a display module disposed on the optical sensing module. The optical sensing module contains an optical sensor array, at least one transparent layer, and a microlens array. The optical sensor array contains at least one optical sensor. The transparent layer is disposed on the optical sensor array. The microlens array contains at least one microlens and is disposed on the transparent layer.

BRIEF DESCRIPTION OF THE DRAWINGS

A detailed description is given in the following embodiments with reference to the accompanying drawings. In should be noted that various features are not drawn to scale and are for illustrative purposes only. In fact, the dimensions of the various features may be arbitrarily increased or reduced for clarity of discussion.

DETAILED DESCRIPTION

Figure 1:
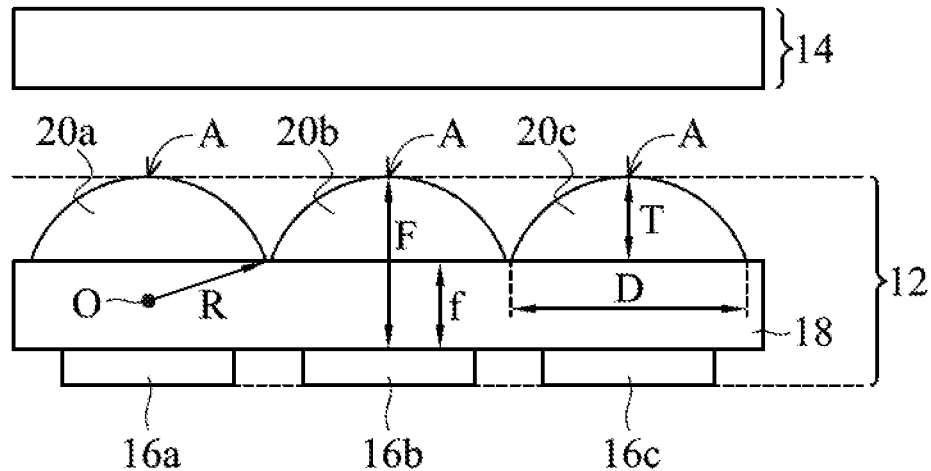
FIG. 1 is a partial cross-sectional view of an electronic device in accordance with an embodiment of the present disclosure.

Various embodiments or examples are provided in the following description to implement different features of the present disclosure. The elements and arrangement described in the following specific examples are merely provided for introducing the present disclosure and serve as examples without limiting the scope of the present disclosure. For example, when a first component is referred to as "on a second component", it may directly contact the second component, or there may be other components in between, and the first component and the second component do not come in direct contact with one another.

It should be understood that additional operations may be provided before, during, and/or after the described method. In accordance with some embodiments, some of the stages (or steps) described below may be replaced or omitted.

In this specification, spatial terms may be used, such as "below", "lower", "above", "higher" and similar terms, for briefly describing the relationship between an element relative to another element in the figures. Besides the directions illustrated in the figures, the devices may be used or operated in different directions. When the device is turned in different directions (such as if it is rotated 45 degrees or other amounts), the spatially related adjectives used in it will also be interpreted according to the turned position. Furthermore, in this specification, expressions such as "first material layer disposed on/over a second material layer", may indicate direct contact of the first material layer with the second material layer, or it may indicate a non-contact state with one or more intermediate layers between the first material layer and the second material layer. In the above situation, the first material layer may not be in direct contact with the second material layer. In some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

Herein, the terms "about", "around" and "substantially" typically mean a value is in a range of +/−20% of a stated value, typically a range of +/−10% of the stated value, typically a range of +/−5% of the stated value, typically a range of +/−3% of the stated value, typically a range of +/−2% of the stated value, typically a range of +/−1% of the stated value, or typically a range of +/−0.5% of the stated value. The stated value of the present disclosure is an approximate value. Namely, the meaning of "about", "around" and "substantially" still exists even if there is no specific description of "about", "around" and "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section from another element, component, region, layer, portion or section from another element, component, region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

Referring to FIG. 1, according to an embodiment of the present disclosure, an electronic device 10 is provided. FIG. 1 is a partial cross-sectional view of the electronic device 10.

In an embodiment shown in FIG. 1, the electronic device 10 includes an optical sensing module 12 and a display module 4. The display module 4 is disposed on the optical sensing module 12. The optical sensing module 12 includes an optical sensor array 16, a transparent layer 18, and a microlens array 20. The optical sensor array 16 includes a plurality of optical sensors (such as 16a, 16b, 16c, which are represented by the reference numeral 16 in this specification for simplicity of explanations.) The transparent layer 18 is disposed on the optical sensor array 16. The microlens array 20 includes a plurality of microlens (such as 20a, 20b, 20c, which are represented by the reference numeral 20 in this specification for simplicity of explanations.) being disposed on the transparent layer 18.

Figure 2:
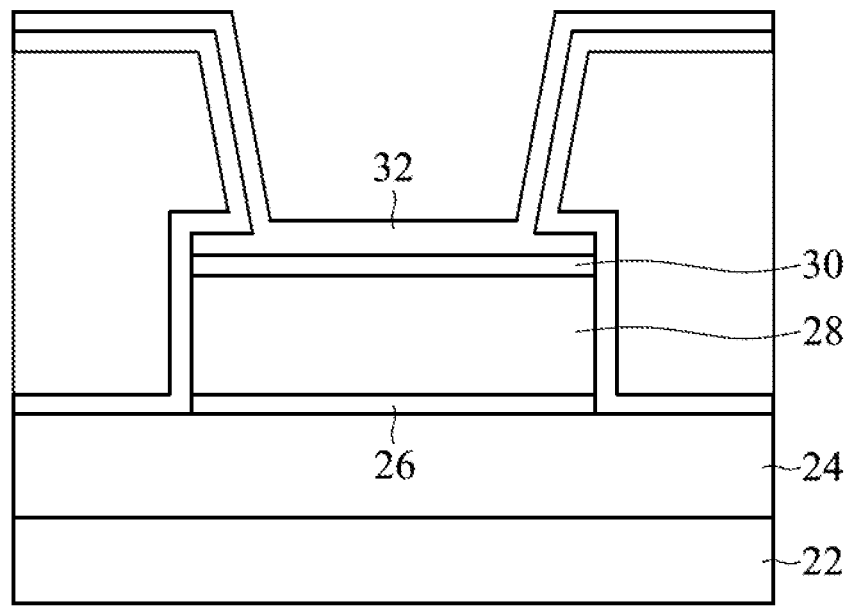
FIG. 2 is a partial cross-sectional view of an optical sensor in accordance with an embodiment of the present disclosure.
Figure 3:
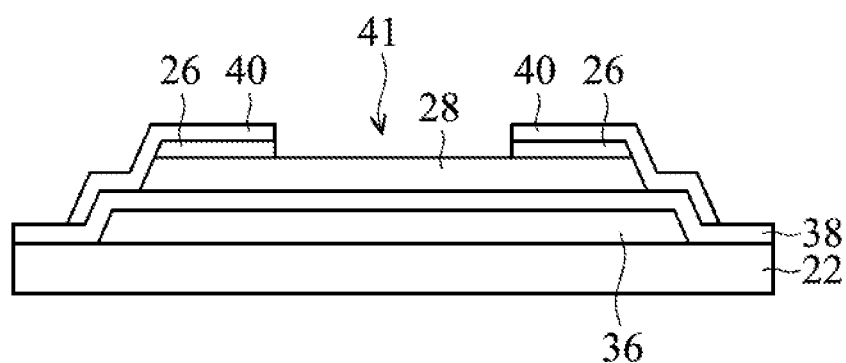
FIG. 3 is a partial cross-sectional view of an optical sensor in accordance with an embodiment of the present disclosure.
Figure 4:
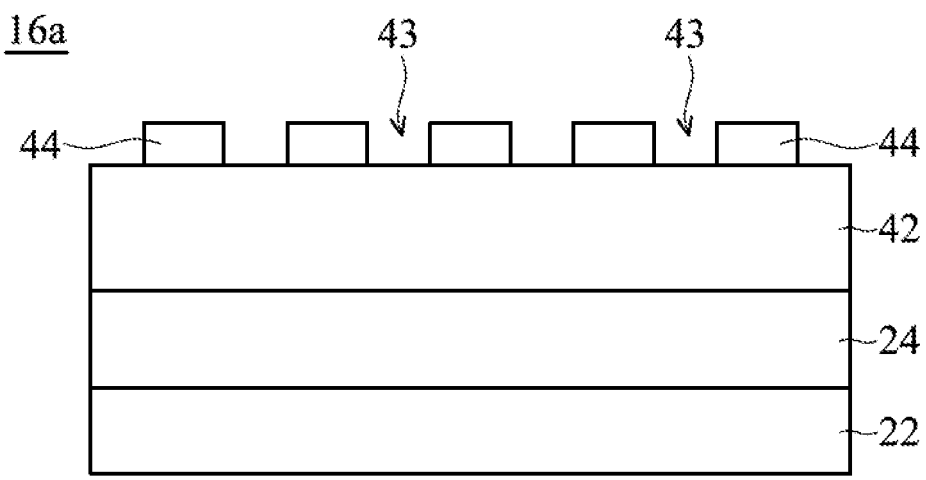
FIG. 4 is a partial cross-sectional view of an optical sensor in accordance with an embodiment of the present disclosure.

Referring to FIG. 2 to FIG. 4, the structure of the optical sensor 16 is further described. FIG. 2 to FIG. 4 are the partial cross-sectional views of the optical sensor 16. The structure of the optical sensor 16 may include, for example, photodiodes, optical thin-film transistors, metal-semiconductor-metal (MSM) sensors, other suitable forms of optical sensors, or a combination of the various aforementioned forms of optical sensors, but it is not limited thereto. The optical sensor 16a is used as an example to illustrate the structure of the optical sensor.

As shown in FIG. 2, the optical sensor 16a is an optical photodiode. The optical sensor 16a includes a substrate 22, a thin-film transistor layer 24, an N-type amorphous layer 26, an intrinsic amorphous silicon layer 28, a P-type amorphous layer 30, and a conductive layer 32, such as indium-tin-oxide (ITO) layer, but is not limited thereto. The thin-film transistor layer 24 is disposed on the substrate 22. The N-type amorphous layer 26 is disposed on the thin-film transistor layer 24 and is electrically connected to the thin-film transistor layer 24. The intrinsic amorphous silicon 28 is disposed on the N-type amorphous layer 26. The P-type amorphous layer 30 is disposed on the intrinsic amorphous silicon layer 28, and the transparent ITO layer 32 may be electrically connected to the P-type amorphous layer 30. It should be noted that, the photodiode in FIG. 2 is only an example, and the present disclosure is not limited thereto. In certain embodiments, the substrate 22 may be selected from rigid substrates, such as glass substrates, sapphire substrates, or the like; or flexible polymer substrates, such as polyimide (PI) substrate, but is not limited thereto.

As shown in FIG. 3, the optical sensor 16a is an optical thin-film transistor. The optical sensor 16a includes a substrate 22, a gate metal layer 36, a gate insulating layer 38, an intrinsic amorphous layer 28, an N-type amorphous silicon layer 26, and a patterned source/drain metal layer 40. The gate metal layer 36 is disposed on the substrate 22. The gate insulating layer 38 is disposed on the gate metal layer 36, the material of which may be silicon nitride, but is not limited thereto. The intrinsic amorphous layer 28 is disposed on the gate insulating layer 38. The N-type amorphous layer 26 is disposed on the intrinsic amorphous layer 28. The patterned source/drain metal layer 40 is disposed on the N-type amorphous layer 26 and has an opening 41. It should be noted that, the structure of the optical thin-film transistor in FIG. 3 is only an example, and the present disclosure is not limited thereto.

As shown in FIG. 4, the optical sensor 16a is a metal-semiconductor-metal (MSM) sensor. The optical sensor 16a includes a substrate 22, a thin-film transistor 24, a photosensitive semiconductor 42, and a patterned metal layer 44. The thin-film transistor layer 24 is disposed on the substrate 22. The photosensitive semiconductor layer 42 is disposed on the thin-film transistor 24. The patterned metal layer 44 is disposed on the photosensitive semiconductor 42 and has an opening 43. It should be noted that, the structure of the metal-semiconductor-metal sensor in FIG. 4 is only an example, and the present disclosure is not limited thereto.

In the embodiment shown in FIG. 1, the transparent layer 18 includes polymeric materials capable of filtering incident lights of certain wavelengths, such as, the polymeric materials capable of filtering wavelength that is shorter than 400 nm and/or longer than 700 nm. More specifically, the material property of the transparent layer 18 has a low transmittance to the incidence light with a wavelength shorter than 400 nm and/or longer than 700 nm. It should be noted that, the low transmittance in this disclosure refers to a transmittance lower than 50%, such as 5%, 10%, 20%, 30%, 40%, etc., but is not limited thereto. The transmittance of the transparent layer is defined as "the percentage of the ratio of the amount of light emitted after penetrating through the transparent layer to the amount of incident light irradiating the transparent layer." Most of the incident light with a wavelength between 400 nm and 700 nm can penetrate through the transparent layer 18. It should be noted that the aforementioned range of filtered light is only an example, and the range of the filtered wavelength of the transparent layer 18 is not limited thereto.

Figure 5A:
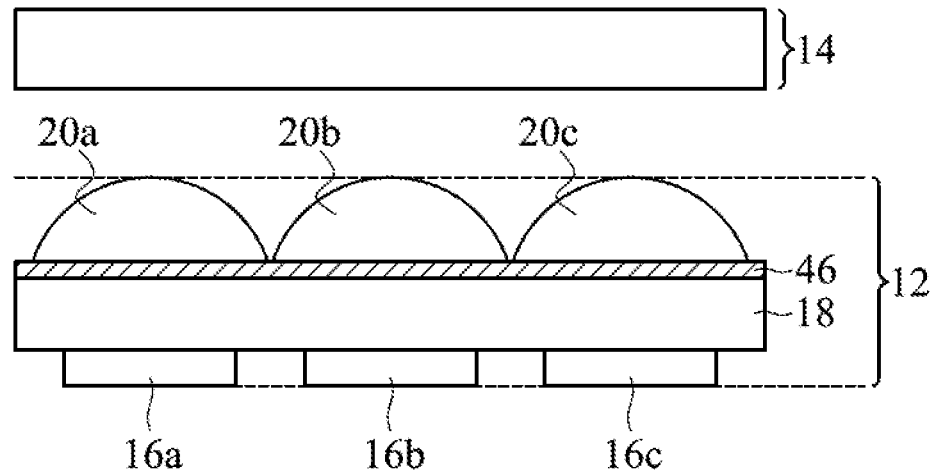
FIG. 5A is a partial cross-sectional view of an electronic device in accordance with an embodiment of the present disclosure.
Figure 5B:
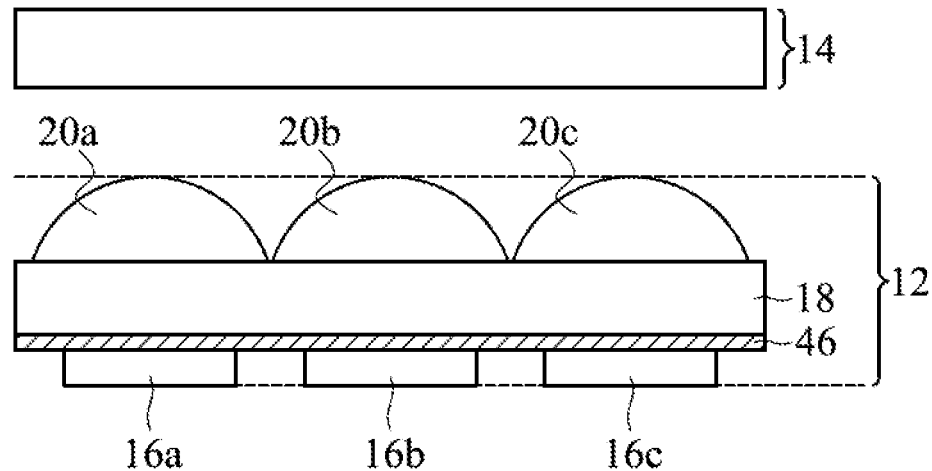
FIG. 5B is a partial cross-sectional view of an electronic device in accordance with an embodiment of the present disclosure.
Figure 5C:
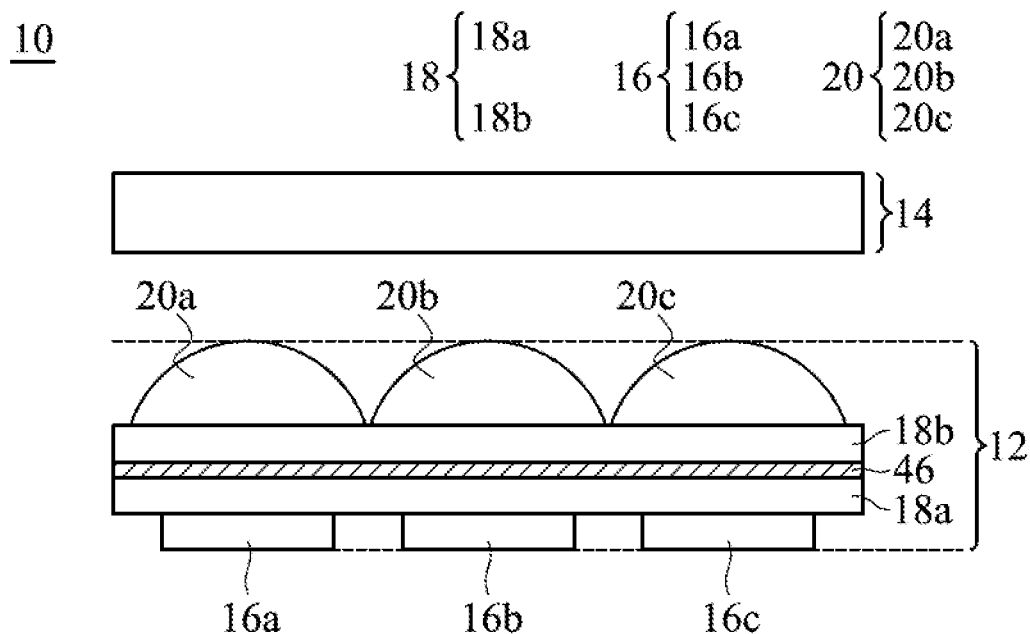
FIG. 5C is a partial cross-sectional view of an electronic device in accordance with an embodiment of the present disclosure.

In this disclosure, apart from using the transparent layer 18 as a light filtering component, in certain embodiments, a filter layer 46 that has a light filtering function (as shown in FIG. 5A) is disposed between the optical sensor array 16 and the microlens array 20, so as to prevent undesirable incident light from entering optical sensor array 16, and in such a case, the transparent layer 18 does not necessarily have the function of light filtering, as shown in FIG. 5A-5C. In an embodiment shown in FIG. 5A-5C, the filter layer 46 is capable of filtering wavelength that is shorter than 400 nm and/or longer than 700 nm. The filter layer 46 may is made of multi-layer films with different refractive indices and are stacked on each other, but the structure and range of the filtered wavelength is not limited thereto.

Referring to FIG. 5A shown in the embodiment, the transparent layer 18 is a single transparent layer, and the filter layer 46 is disposed between the transparent layer 18 and the microlens array 20. Referring to FIG. 5B, in the embodiment shown in FIG. 5B, the transparent layer 18 is a single transparent layer, and the filter layer 46 is disposed between the transparent layer 18 and the optical sensor array 16. Referring to FIG. 5C, in the embodiment shown in FIG. 5C, the transparent layer 18 is a multi-layer transparent layer, which includes a first transparent layer 18a and a second transparent layer 18b, and the filter layer 46 is disposed between the first transparent layer 18a and the second transparent layer 18b. In this disclosure, the arrangements of the transparent layer 18 and the filter layer 46 are not limited to the above manners, the amount and location of the filter layer 46 could be optimally adjusted according to the requirement, so that the optical sensor array 16 could receive the most desirable incident light.

Figure 6:
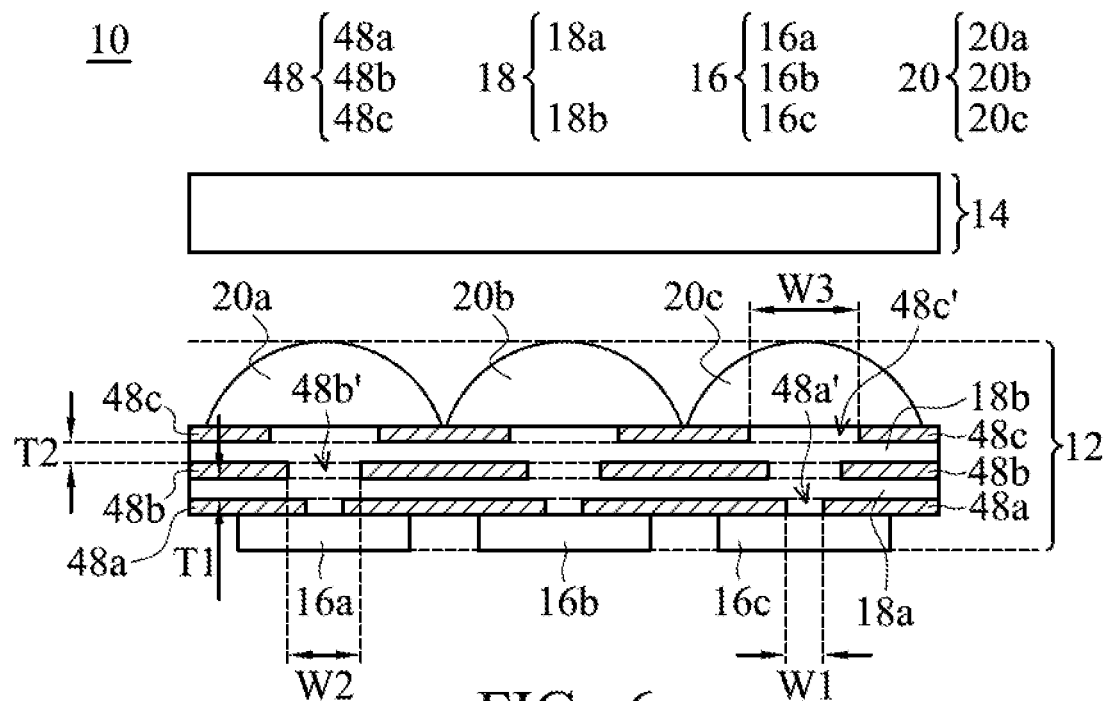
FIG. 6 is a partial cross-sectional view of an electronic device in accordance with an embodiment of the present disclosure.

In certain embodiments of the present disclosure, a light shielding layer 48 is disposed between the optical sensor array 16 and the microlens array 20, as shown in FIG. 6. In the embodiment shown in FIG. 6, the light shielding layer 48 includes a first light shielding layer 48a, a second light shielding layer 48b, and a third light shielding layer 48c. The first light shielding layer 48a has at least one first opening 48a', the second light shielding layer 48b has at least one second opening 48b', and the third light shielding layer 48c has at least one third opening 48c'. Herein, the transparent layer 18 is a multi-layer transparent layer, which includes the first transparent layer 18a and the second transparent layer 18b, and the light shielding layer 48 and the transparent layer 18 are stacked on each other. More specifically, in FIG. 6, the first light shielding layer 48a is disposed on the optical sensor array 16, the first transparent layer 18a is disposed on the first light shielding layer 48a, the second light shielding layer 48b is disposed on the first transparent layer 18a, the second transparent layer 18b is disposed on the second light shielding layer 48b, and the third light shielding layer 48c is disposed on the second transparent layer 18b. The width W1 of the first opening 48a' of the first light shielding layer 48a is between 1 µm and 50 µm. The width W2 of the second opening 48b' of the second light shielding layer 48b is between 5 µm and 75 µm. The width W3 of the third opening 48c' of the third light shielding layer 48c is between 5 µm and 100 µm. In addition, the width W3 of the third opening 48c' of the third light shielding layer 48c is larger than the width W2 of the second opening 48b', the width W2 of the second opening 48b' of the second light shielding layer 48b is larger than the width W1 of the first opening 48a' of the first light shielding layer 48a. In addition, the thickness T1 of the first transparent layer 18a is between 1 µm and 20 µm. The thickness T2 of the second transparent layer 18b is greater than the thickness T1 of the first transparent layer 18a. It should be noted that, in this disclosure, the arrangement of the light shielding layer 48 is not limited to the aforementioned embodiments, the number of the light shielding layer 48, the thickness of each layer, the size of the opening, and the thickness of the transparent layer 18 may be adjusted optimally, ensuring that the optical sensor 16 could receive sufficient amount of positive light, and reduce lateral incident light from different angles, thereby reducing the possibilities that the electrical signals of the optical sensors are affected by the lateral incident light.

In certain embodiments, the material of the light shielding layer 48 may include black photoresist to absorb the light irradiated on the light shielding layer 48, reducing the possibilities of the lateral incident light to irradiate the optical sensor 16 directly or to irradiate the optical sensor 16 after being reflected back and forth between the light shielding layer 48. In certain embodiments, the light shielding layer may be made of a single metal layer, or a metal layer and a photoresist layer, or a metal layer and an inorganic layer. The photoresist layer may include a green photoresist layer, and may be a red photoresist layer or a blue layer, but the color of the photoresist layer may not be limited thereto. When the light shielding layer 48 is made of the metal layer and the photoresist layer, at least one photoresist layer is disposed above or below the metal layer. In the case of a multi-layer photoresist layer, each photoresist layer may contain different colors and form a stacked structure. When the photoresist layer is disposed on the metal layer, the lateral incident light passes through the photoresist layer before irradiating the metal layer, the photoresist layer could filter out most of the side light, and most of the remaining lateral incident light would be reflected after irradiating the metal layer, so as to reduce the occurrence of the lateral incident light penetrating to the optical sensor. The reflected light would penetrate through the photoresist layer again, and by the time most of the light is filtered. As a result, the amount of the incident light irradiating the optical sensor is close to zero after being reflected back and forth between the light shielding layer. The advantages of the light shielding layer 48 being made of the metal layer and the inorganic layer is that, in comparison to compared to the aperture of the opening of the light shielding layer formed by the black photoresist material, a smaller aperture of the opening may be formed by the lithography process of the exiting display device, in order to shield the lateral incident light of a larger angle range.

As shown in FIG. 1, in some embodiments, the material property of the microlens 20 is that it could filter incident lights of certain wavelengths. For example, the material property of the microlens is having low transmittance to the incident lights of wavelengths shorter than 400 nm and/or longer than 700 nm, and most of the incident lights of wavelengths between 400 nm and 700 nm would penetrate through microlens 20. It should be noted that the aforementioned embodiment is only an example, and the range of the filtered wavelength of the microlens is not limited thereto.

As shown in FIG. 1, the corresponding relationship of the optical sensor 16 and the microlens 20 is a one-to-one correspondence. In the embodiment shown in FIG. 1, the relationship between the relative size of each component can be explained as follows.

In order to allow the final image of the lens to be focused on the optical sensor, the distance between the top A of the microlens 20 and the optical sensor 16 is defined as F (which is also the focal distance of the microlens), the thickness of the microlens 20 is defined as T, and the thickness of the transparent layer 18 is defined as f, and thereby the distance F between the top A of the microlens 20 and the optical sensor 16 minus the thickness T of the microlens substantially equals to the thickness f of the transparent layer 18, as shown in the corresponding formula: $f = F - T$.

Besides, the radius of curvature of the microlens is defined as R, and the spherical center of the microlens 20 is defined as O. In the embodiment shown in FIG. 1, the spherical center O of the microlens 20 is in the transparent layer 18. In certain embodiment, the spherical center O of the microlens 20 may be adjusted to be within the microlens 20 depending on the product requirement.

In the embodiment shown in FIG. 1, the relationship of the radius of curvature R and the focal length F of the microlens 20 is defined as follows:

$$n2/n1=F/(F-R)$$

In the formula above, n1 is the refractive index of the air or the material located at the periphery of the microlens 20, n2 is the refractive index of the material of the microlens 20 and/or the transparent layer 18.

For example, if the light enters from the air to the optical sensor array 12, the refractive index n1 of the air is about 1, the refractive index n2 of the microlens 20 and/or the transparent layer 18 is about 1.5, and hence F approximately equals to three times or nearly three times of R. At the same time, the optical sensor 16 could receive more forward incident light, which increases the signal to noise ratio (SNR). The optical sensor array 12 may have higher sensitivity, which could be used in the application of low illumination. The refractive index n2 of the microlens 20 and/or transparent layer 18 is not limited to 1.5, and in certain embodiments, the range of n2 may be between 1.3 and 1.9.

In certain embodiments, the display module 14 may include liquid-crystal display (LCD), light emitting diode (LED) display, organic light emitting diode (LED) display, inorganic light emitting diode display such as sub-millimeter light emitting diode (mini-LED) display, micro light emitting diode (μ-LED) display or quantum dot light emitting diode (Q-LED or QD-LED) display, etc., but is not limited thereto.

In certain embodiment of this disclosure, the electronic device 10 may be applied in the under-display fingerprint recognition of the display device. When a finger touches the display module 14, the light emitted from the display module 14 or external light is reflected after irradiating the fingerprint, in which part of the incident light of small angle continues to penetrate the microlens 20 and the transparent layer 18 after penetrating through the display module 14 and irradiates on the optical sensor 16. The optical sensor 16 converts a light signal it received into an electrical signal, and the back-end system integrates the electrical signal for fingerprint recognition.

Figure 7:
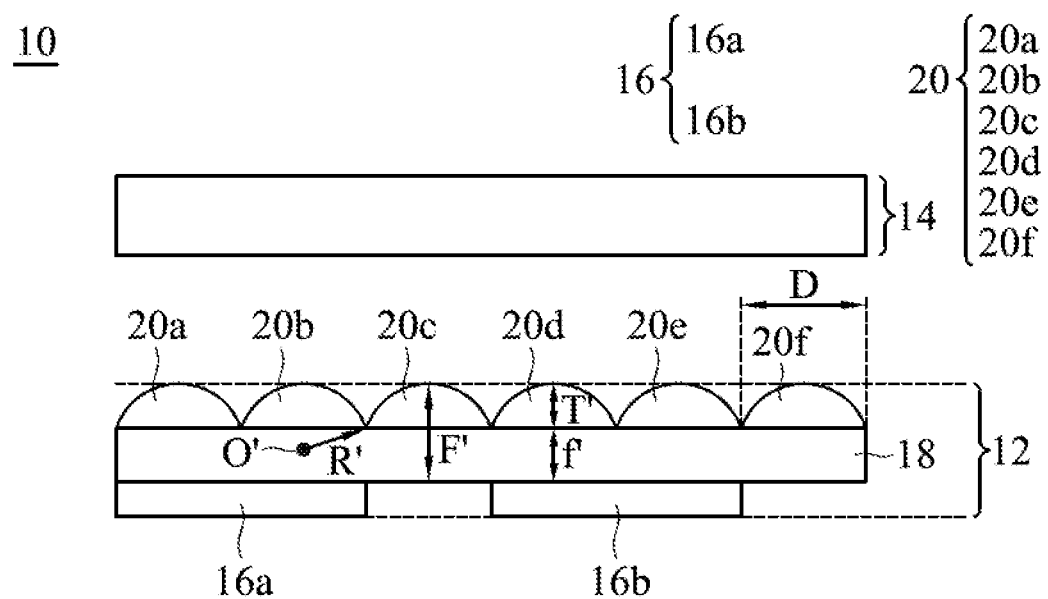
FIG. 7 is a partial cross-sectional view of an electronic device in accordance with an embodiment of the present disclosure.

Referring to FIG. 7, according to an embodiment of this disclosure, an electronic device 10 is provided. FIG. 7 is a partial cross-sectional view of an electronic device.

In the embodiment shown in FIG. 7, the electronic device 10 includes an optical sensor module 12 and a display module 14. The display module 14 is disposed on the optical sensor module 12. The optical sensor module 12 includes an optical sensor array 16, a transparent layer 18, and a microlens array 20. The optical sensor array 16 includes a plurality of optical sensors (such as 16a, 16b). The transparent layer 18 is disposed on the optical sensor array 16. The microlens array 20 includes a plurality of microlens (such as 20a, 20b, 20c, 20d, 20e, 20f), and is disposed on the transparent layer 18. The structure of the optical sensor 16 is similar to that of the aforementioned embodiments, which may include, for example, a photodiode, optical thin-film transistor, or metal-semiconductor-metal sensor, and the related structures are as shown in FIGS. 2-4, which are not repeated herein.

In the embodiment shown in FIG. 7, the material property and use of the transparent layer 18 may be substantially similar to that of the aforementioned embodiments, and hence are not repeated herein.

In certain embodiments of this disclosure, the light filtering layer 48 is disposed between the optical sensor assay 16 and the microlens array 20. The number of layers of the light shielding layer 48, the thickness of each layer, the size and material of the opening, and the thickness of the transparent layer 18 may be similar to the aforementioned embodiments, and hence are not repeated herein.

In the embodiment shown in FIG. 7, the material property of the microlens 20 may be substantially similar to that of the aforementioned embodiments, and hence they are not repeated herein. The main difference is depicted in FIG. 7, the corresponding relationship of the optical sensor 16 and the microlens 20 is one-to-many correspondence. For example, the optical sensor 16a corresponds to microlens 20a, 20b, and the optical sensor 16b corresponds to microlens 20d, 20e. In the embodiment shown in FIG. 7, the relationship between the relative size of each component may be explained as follows.

The distance between the top A of the microlens 20 and the optical sensor 16 (which is also the focal distance of the microlens 20) is defined as F', the thickness of the microlens 20 is defined as T', and the thickness of the transparent layer 18 is defined as f, and thereby the distance between the top A of the microlens 20 and the optical sensor 16 minus the thickness T' of the microlens 20 substantially equals to the thickness f' of the transparent layer 18, as shown in the corresponding formula f'=F'−T'.

Besides, the radius of curvature of the microlens 20 is defined as R', and the spherical center of the microlens 20 is defined as O'. In the embodiment shown in FIG. 7, the spherical center O' of the microlens 20 is in the transparent layer 18. In certain embodiment, the spherical center O of the microlens 20 may be adjusted to be within the microlens 20 depending on the product requirement.

Similar to the aforementioned embodiments, in the embodiment shown in FIG. 7, the relationship of the radius of curvature R' of the microlens 20 and the focal length F' of the incident light is defined as follows:

$$n2/n1=F'/(F'-R')$$

In the above formula, n1 is the refractive index of the air or the material located at the periphery of the microlens 20, n2 is the refractive index of the material of the microlens 20 and/or the transparent layer 18.

Comparing the optical sensor array shown in FIG. 1 and FIG. 7, when the single optical sensor (16a, 16b) corresponds to multiple microlens 20, the radius of curvature of the microlens 20 may be decreased from R to R'. As can be seen from the formula, in the case of the embodiments shown in FIG. 1 and FIG. 7 having the same condition such as the environment and the material (i.e., the refractive indices n1, n2 remain the same in the two embodiments), a positive correlation was found between the focal length and the radius of curvature. Therefore, the focal length F' is smaller than the focal length f. The focal length F' equals to the addition of the thickness f' of the transparent layer and the thickness T' of the microlens 20, and hence in the case of having the same thickness T' of the microlens (i.e., T' in FIG. 7=T in FIG. 1), the thickness of the transparent layer 18 would decrease to f. That is, the thickness f of the transparent layer of the optical sensor module 12 in FIG. 7 (where a single optical sensor corresponds to two microlens) would be lesser than the thickness f of the transparent layer of the optical sensor module 12 in FIG. 7 (where a single optical sensor corresponds to a single microlens). It should be noted that, the case of a single optical sensor corresponding to two microlenses in FIG. 7 is only an example, but in practice, the corresponding number of microlenses for a single optical sensor is not limited thereto.

The manufacturing process of the transparent layer 18 with a lesser thickness shows a similar process capability to that of the existing display device. As a result, the manufacturing process not only has a high yield stability, but could also reduce development costs.

In the embodiment shown in FIG. 7, the thickness D of the microlens 20 is between 5 µm and 100 µm, the thickness T' of the microlens 20 is between 1 µm and 50 µm, and the thickness f' of the transparent layer 18 is between 1 µm and 50 µm.

Similar to the aforementioned embodiment, in certain embodiments, the display module 14 may include liquid-crystal display (LCD), and light emitting diode (LED) display, but is not limited thereto.

Similar to the aforementioned embodiment, in the embodiment shown in FIG. 7, the electronic device 10 may be applied in under-display fingerprint recognition of the display device. Please refer to the aforementioned embodiments for a description of the sensing method of the electronic device. This description will not be repeated herein.

Figure 8A:
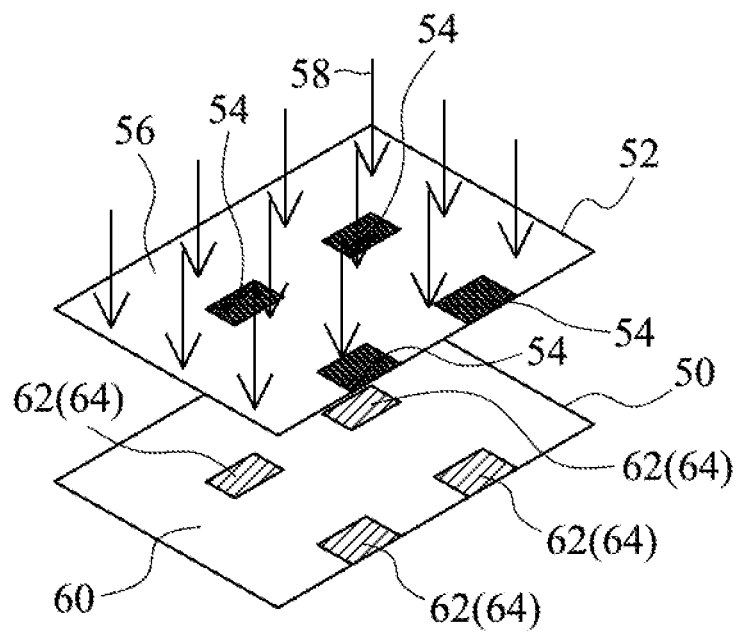
FIG. 8A is a partial schematic view of a method for manufacturing a light shielding layer in accordance with an embodiment of the present disclosure.

Referring to FIG. 8A, according to an embodiment of the present disclosure, a method for manufacturing the electronic device that may be used in this disclosure is provided. FIG. 8A is a partial schematic view of a method for manufacturing a light shielding layer.

As shown in FIG. 8A, firstly, a black negative photoresist layer 50 is formed on the existing structure (not shown). Next, a photomask 52 is provided. The photomask includes a light shielding region 52 and a light transmission region 56. Then, an exposure process 58 is performed to produce a light shielding layer with an opening. Since the material of the light shielding layer is a black negative photoresist, after the exposure process 58, an exposed region 60 on the black negative photoresist layer 50 remains after developing process, and an unexposed region 62 is removed after developing process, an opening 64 of the light shielding layer is formed at the place that the unexposed region is removed. Herein, the opening of the light shielding layer is defined after removing a single photomask. It should be noted that, the material of the light shielding layer and the related process in this disclosure are not limited thereto.

Figure 8B:
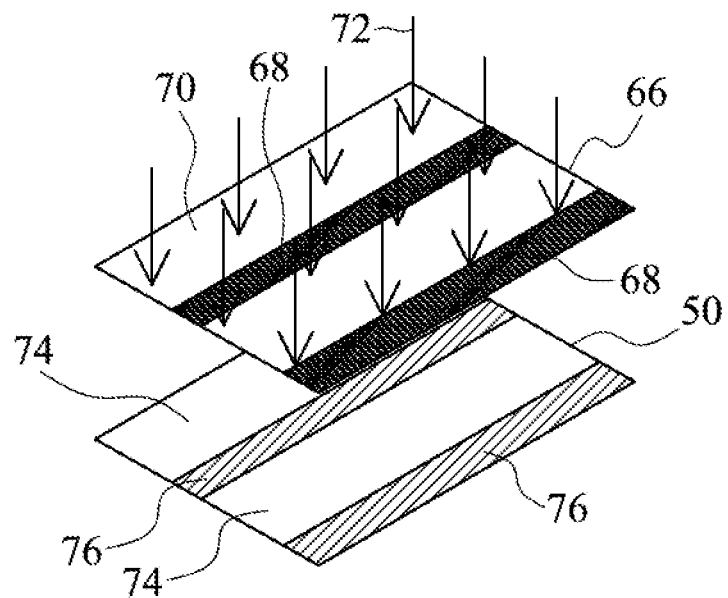
FIG. 8B-8C is a partial schematic view of a method for manufacturing a light shielding layer in accordance with an embodiment of the present disclosure.
Figure 8C:
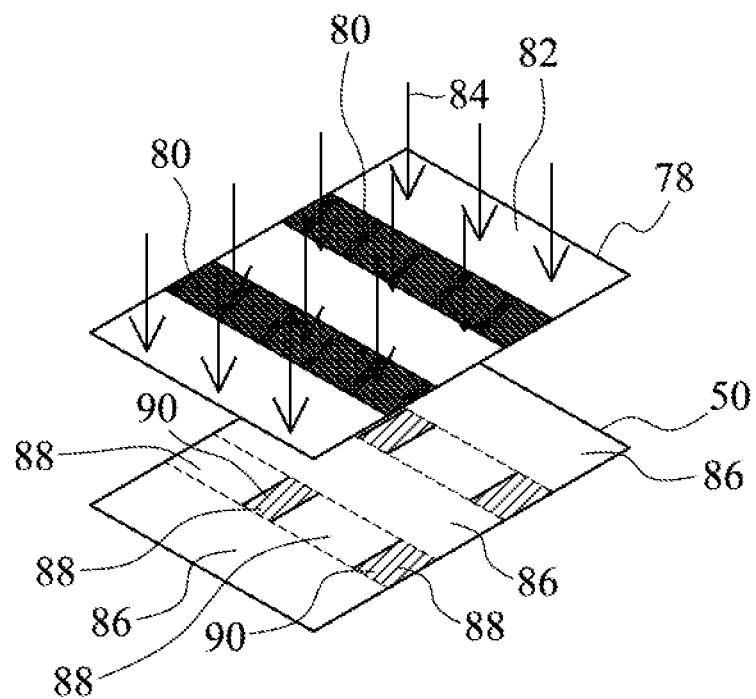

Referring to FIGS. 8B-8C, according to an embodiment of this present disclosure, a method for manufacturing a light shielding layer is provided. FIGS. 8B-8C are a partial schematic view of a method for manufacturing a light shielding layer.

When the manufacturing of the openings with very small apertures (e.g. lower than 10 µm) is attempted, due to the limitations of the process tool, the opening process of the light shielding layer may not be achieved with only one exposure. In such a case, the very small apertures may be produced in a step-wise manner via multiple exposures with several photomasks. Firstly, the black negative photoresist layer 50 is formed on the existing structure (not shown). Next, a photomask 66 is provided. The photomask 66 includes a light shielding region 68 and a light transmission region 70. Then, a first exposure process 72 is performed. After the first exposure process 72, an exposed region 74 and an unexposed region 76 are formed on the black negative photoresist layer 50. Later, another photomask 78 is provided. The photomask 78 includes a light shielding region 80 and a light transmission region 82. Then, a second exposure process 84 is performed. After the second exposure process 84, an exposed region 86 and an unexposed region 88 is formed on the black negative photoresist layer 50. On the black negative photoresist layer 50, the overlapping area of the unexposed region 76 formed in the first exposure process 72 and the unexposed region 88 formed in the second exposure process 84 will be removed after developing process, and an opening 90 of the light shielding layer is formed in the area that is removed. As shown in FIGS. 8B-8C, the opening with a smaller aperture may be manufactured after two exposure processes. This manufacturing process could not only prevent the need of purchasing new process tools, but could also solve the instability issue for the yield of the openings.

Figure 9:
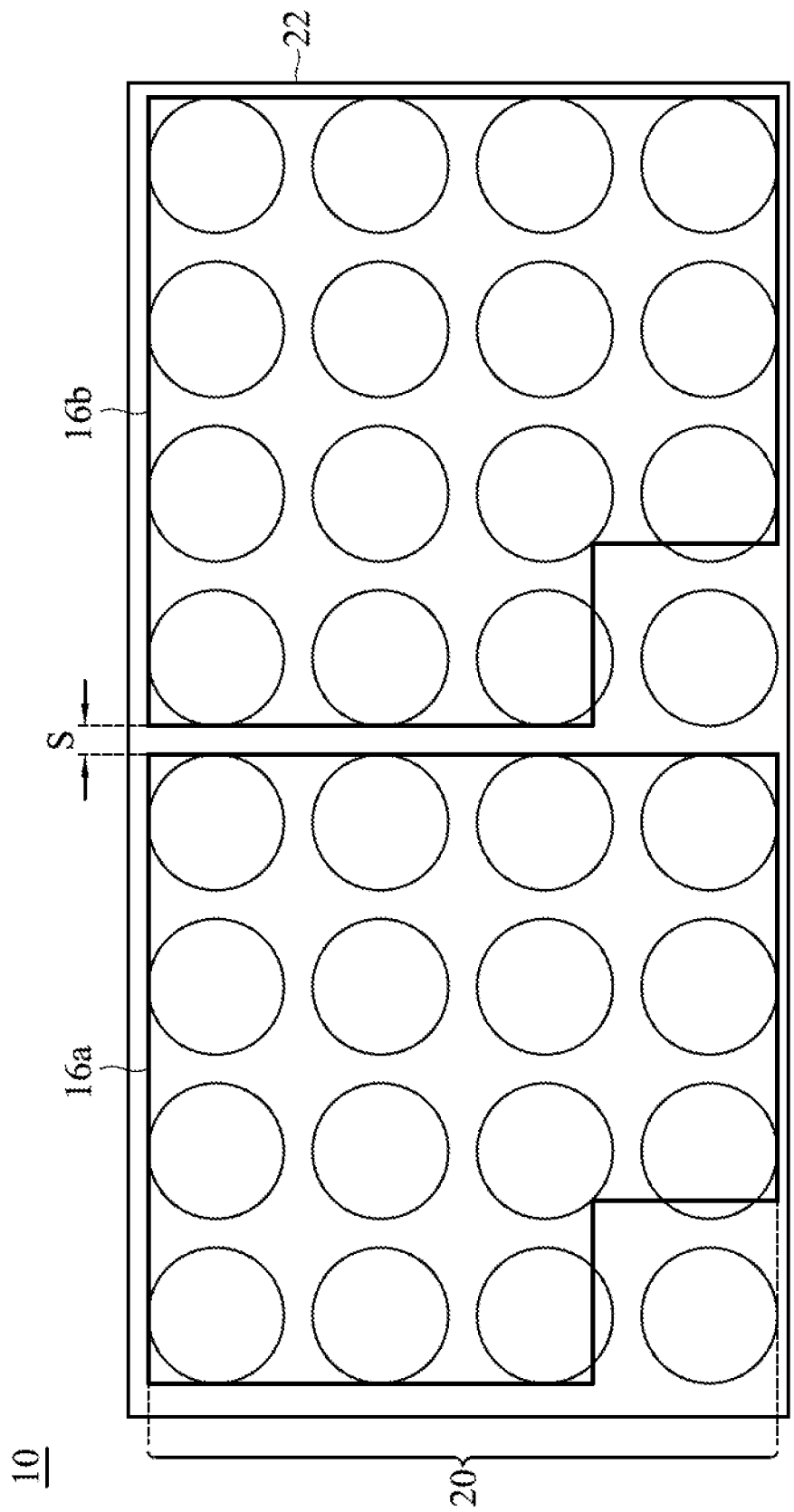
FIG. 9 is a partial top view of an electronic device in accordance with an embodiment of the present disclosure

Referring to FIG. 9, according to an embodiment of the present disclosure, an electronic device 10 is provided. FIG. 9 is a partial top view of an electronic device.

As shown in FIG. 9, the optical sensors 16a, 16b are disposed on the substrate 22. The microlens array 20 is disposed on the optical sensor 16a, 16b. In certain embodiments, the substrate 22 may be selected from rigid substrates, such as glass substrates, sapphire substrates, etc.; or flexible polymer substrates, such as polyimide (PI) substrate, but is not limited thereto. In the embodiment shown in FIG. 9, the spacing S between the optical sensors 16a and 16b is approximately between 0.5 µm and 10 µm. Herein, the corresponding relationship of the optical sensors 16a, 16b and the microlens array 20 is that a single optical sensor may correspond to multiple microlens. For example, the optical sensors 16a, 16b may correspond to 15 microlens respectively, but is not limited thereto. It should be noted that, the microlens of the microlens array 20 of this disclosure may be distributed continuously (there is no gap between the adjacent microlens, as shown in FIG. 1) or non-continuously (there is a gap between the adjacent microlens, as shown in FIG. 9).

Since the optical sensors 16a, 16b are disposed on the glass substrate or the polyimide (PI) substrate that can be fabricated in a large area, the sensing area may be significantly increased, such as to an area with more than 10,000 µm². Apart from the under-screen fingerprint recognition of the display device, the structure of the optical sensor may be applied in devices with large areas such as car doors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The reference to features, advantages or similar language throughout the specification does not suggest that all the features and advantages that can be implemented by the present disclosure should or can be implemented in any single embodiment of the present disclosure. In contrast, language related to features and advantages is interpreted as that a particular feature, advantage, or characteristic described in conjunction with an embodiment is included in at least one embodiment of the present disclosure. Therefore, the discussion of features, advantages and similar language throughout the specification may, but does not necessarily, represent the same embodiment.

Furthermore, in one or more embodiments, the described features, advantages, and characteristics of the present disclosure may be combined in any suitable manner. Based on the description herein, those skilled in the art will realize that the present disclosure can be implemented without one or more specific features or advantages of a specific embodiment. In other cases, additional features and advantages can be identified in some embodiments, and these may not present in all embodiments of the present disclosure.

What is claimed is:

1. An electronic device, comprising:
   an optical sensing module, comprising:
   an optical sensor array comprising a plurality of optical sensors;
   at least one transparent layer disposed on the optical sensor array;
   a microlens array comprising at least one microlens and disposed on the transparent layer; and
   at least one light shielding layer with an opening disposed between the optical sensor array and the microlens array, wherein the light shielding layer and the transparent layer are stacked on each other,
   wherein a configuration of the optical sensing module conforms to a formula $n2/n1=F/(F-R)$, in which n1 is a refractive index of air or a material at a periphery of the microlens, n2 is a refractive index of the microlens, F is a distance between a top of the microlens and the optical sensor, and R is a radius of curvature of the microlens,
   wherein one of the plurality of the optical sensors corresponds to a plurality of microlenses in one-to-many correspondence,
   wherein, in a cross-sectional view, the microlens has a maximum width, and an overlapping range between the microlens and the light shielding layer is greater than or equal to 50% of the maximum width and is less than or equal to 85% of the maximum width in a normal direction of the light shielding layer.

2. The electronic device as claimed in claim 1, wherein the optical sensor comprises a photodiode, a photo thin-film transistor, or a metal-semiconductor-metal sensing device.

3. The electronic device as claimed in claim 2, wherein the photodiode comprises:
   a thin-film transistor layer disposed on a substrate;
   an N-type amorphous layer disposed on the thin-film transistor layer and electrically connected to the thin-film transistor layer;
   an intrinsic amorphous silicon disposed on the N-type amorphous layer;
   a P-type amorphous layer disposed on the intrinsic amorphous silicon layer; and
   a conductive layer electrically connected to the P-type amorphous layer.

4. The electronic device as claimed in claim 2, wherein the photo thin-film transistor comprises:
   a gate metal layer disposed on a substrate;
   a gate insulating layer disposed on the gate metal layer;
   an intrinsic amorphous layer disposed on the gate insulating layer;
   a N-type amorphous layer disposed on the intrinsic amorphous layer; and
   a patterned source/drain metal layer disposed on the N-type amorphous layer.

5. The electronic device as claimed in claim 2, wherein the metal-semiconductor-metal sensor comprises:
   a thin-film transistor layer disposed on a substrate;
   a photosensitive semiconductor layer disposed on the thin-film transistor; and
   a patterned metal layer disposed on the photosensitive semiconductor.

6. The electronic device as claimed in claim 1, wherein the transparent layer filters an incident light with a wavelength lower than 400 nm or higher than 700 nm.

7. The electronic device as claimed in claim 1, wherein the transparent layer is a multi-layer transparent layer.

8. The electronic device as claimed in claim 1, wherein the transparent layer comprises:
   a first transparent layer and a second transparent layer disposed on the first transparent layer; and
   a thickness of the second transparent layer is greater than a thickness of the first transparent layer.

9. The electronic device as claimed in claim 1, further comprising at least one filter layer disposed between the optical sensor array and the microlens array, wherein the filter layer comprises multilayer films that have different refractive indices and are stacked on each other.

10. The electronic device as claimed in claim 9, wherein the filter layer filters an incident light with a wavelength lower than 400 nm or higher than 700 nm.

11. The electronic device as claimed in claim 1, wherein the light shielding layer comprises a metal layer.

12. The electronic device as claimed in claim 1, wherein the light shielding layer further comprises at least one photoresist layer, disposed on the metal layer.

13. The electronic device as claimed in claim 1, wherein the light shielding layer comprises:
   a first light shielding layer, a second light shielding layer disposed on the first light shielding layer, and a third light shielding layer disposed on the second light shielding layer;
   the first light shielding layer has at least one first opening, the second light shielding layer has at least one second opening, and the third light shielding layer has at least one third opening; and
   a width of the third opening of the third light shielding layer is larger than a width of the second opening, and the width of the second opening of the second light shielding layer is larger than a width of the first opening of the first light shielding layer.

14. The electronic device as claimed in claim 1, wherein a material of the light shielding layer comprises black photoresist.

15. The electronic device as claimed in claim 1, wherein a distance between the top of top of the microlens and the optical sensor equals to three times of the radius of curvature of the microlens.

16. The electronic device as claimed in claim 1, wherein a retractive index of each of the microlens and the transparent layer is between 1.3 and 1.9.

17. An electronic device, comprising:
   an optical sensing module, comprising:
   an optical sensor array comprising a plurality of optical sensors;
   at least one transparent layer disposed on the optical sensor array;
   a microlens array comprising at least one microlens, disposed on the transparent layer; and
   at least one light shielding layer with an opening disposed between the optical sensor array and the microlens array, wherein the light shielding layer and the transparent layer are stacked on each other,
   wherein a configuration of the optical sensing module conforms to a formula $n2/n1=F/(F-R)$, in which n1 is a refractive index of air or a material at a periphery of the microlens, n2 is a refractive index of the microlens, F is a distance between a top of the microlens and the optical sensor, and R is a radius of curvature of the microlens, wherein one of the plurality of the optical sensors corresponds to a plurality of microlenses in one-to-many correspondence, wherein, in a cross-sectional view, the microlens has a maximum width, and an overlapping range between the microlens and the light shielding layer is greater than or equal to 50% of the maximum width, and is less than or equal to 85% of the maximum width in a normal direction of the light shielding layer; and a display module disposed on the optical sensing module.

\* \* \* \* \*